(12) United States Patent
Dong et al.

(10) Patent No.: US 10,461,768 B1
(45) Date of Patent: Oct. 29, 2019

(54) DIGITAL-TO-ANALOG CONVERTER (DAC) DESIGN WITH REDUCED SETTLING TIME

(71) Applicant: QUALCOMM Incorporated, San Diego, CA (US)

(72) Inventors: Zongyu Dong, San Jose, CA (US); Andrew Weil, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/208,724

(22) Filed: Dec. 4, 2018

(51) Int. Cl.
*H03M 1/66* (2006.01)
*H03M 1/80* (2006.01)
*H03M 1/06* (2006.01)

(52) U.S. Cl.
CPC ......... *H03M 1/808* (2013.01); *H03M 1/0604* (2013.01); *H03M 1/0626* (2013.01); *H03M 1/802* (2013.01)

(58) Field of Classification Search
CPC ... H03M 1/808; H03M 1/0626; H03M 1/0631
USPC ................................ 341/144, 136, 142, 135
See application file for complete search history.

(56) References Cited

U.S. PATENT DOCUMENTS

| | | | |
|---|---|---|---|
| 9,673,782 B1* | 6/2017 | Andrabi | H04B 1/005 |
| 10,230,378 B2* | 3/2019 | Thuries | H03H 11/20 |
| 2002/0181135 A1* | 12/2002 | Takeuchi | G11B 5/02 |
| | | | 360/66 |

* cited by examiner

*Primary Examiner* — Peguy Jean Pierre
(74) *Attorney, Agent, or Firm* — Patterson & Sheridan, L.L.P.

(57) ABSTRACT

Certain aspects of the present disclosure provide a digital-to-analog converter (DAC). The DAC generally includes a plurality of transistors selectively coupled to an output of the DAC, and a biasing circuit coupled to gates of the plurality of transistors. The biasing circuit may include a first transistor having a gate coupled to a drain of the first transistor, a first buffer having an input coupled to the gate of the first transistor, a second transistor having a gate coupled to an output of the first buffer, a first resistive-capacitive (RC) circuit having a first resistive element and a first capacitive element, the first RC circuit being coupled between the gate of the first transistor and the gate of the second transistor, and a first switch coupled between the first resistive element and the first capacitive element.

20 Claims, 6 Drawing Sheets

DIGITAL-TO-ANALOG CONVERTER (DAC) DESIGN WITH REDUCED SETTLING TIME

TECHNICAL FIELD

Certain aspects of the present disclosure generally relate to electronic circuits and, more particularly, to a digital-to-analog converter (DAC).

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry. The RF front-end circuitry may include one or more digital-to-analog converters (DACs) for converting digital baseband signals to analog signals for transmission.

SUMMARY

Certain aspects of the present disclosure provide a digital-to-analog converter (DAC). The DAC generally includes a plurality of transistors selectively coupled to an output of the DAC, and a biasing circuit coupled to gates of the plurality of transistors. The biasing circuit may include a first transistor having a gate coupled to a drain of the first transistor, a first buffer having an input coupled to the gate of the first transistor, a second transistor having a gate coupled to an output of the first buffer, a first resistive-capacitive (RC) circuit having a first resistive element and a first capacitive element, the first RC circuit being coupled between the gate of the first transistor and the gate of the second transistor, and a first switch coupled between the first resistive element and the first capacitive element.

Certain aspects of the present disclosure provide a digital-to-analog converter (DAC). The DAC generally includes a plurality of transistors selectively coupled to an output of the DAC, and a biasing circuit coupled to gates of the plurality of transistors. The biasing circuit may include a first transistor having a gate coupled to a drain of the first transistor, a buffer having an input coupled to the gate of the first transistor, a second transistor, a switch coupled between a gate of the second transistor and an output of the buffer, and a low-pass filter coupled between the gate of the first transistor and the gate of the second transistor.

Certain aspects of the present disclosure provide a method for digital-to-analog conversion. The method generally includes selectively coupling a plurality of a transistors to an output node based on a digital input signal, generating a biasing signal for controlling the plurality of transistors via a current mirror having a first transistor and a second transistor, and selectively filtering a signal at the gate of the second transistor via a resistive-capacitive (RC) circuit having a resistive element and a capacitive element. In certain aspects, a buffer is selectively coupled between gates of the first transistor and the second transistor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
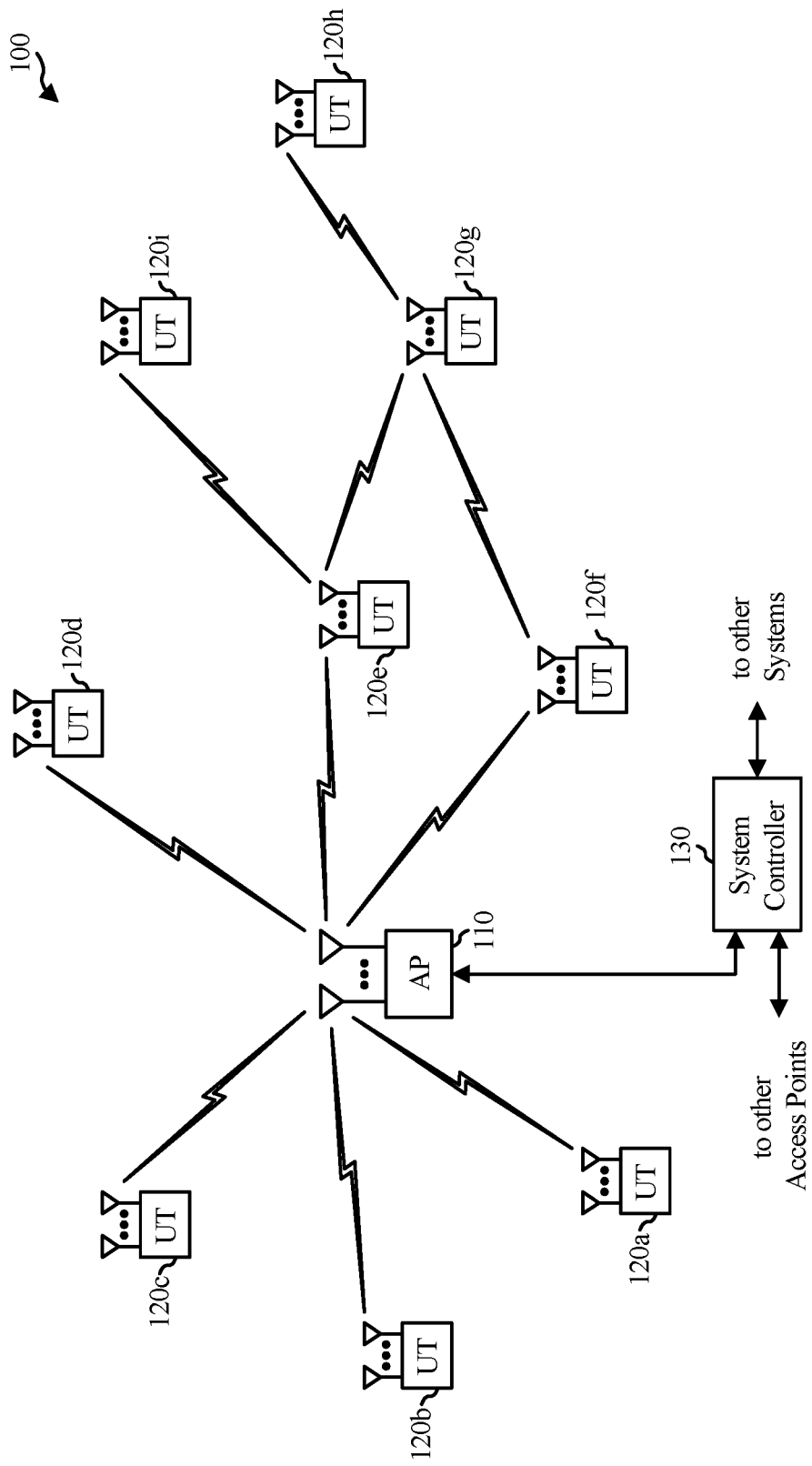
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a digital-to-analog converter (DAC) implemented using a biasing circuit with reduced settling time as compared to conventional biasing circuits, as described in more detail herein.

Figure 2:
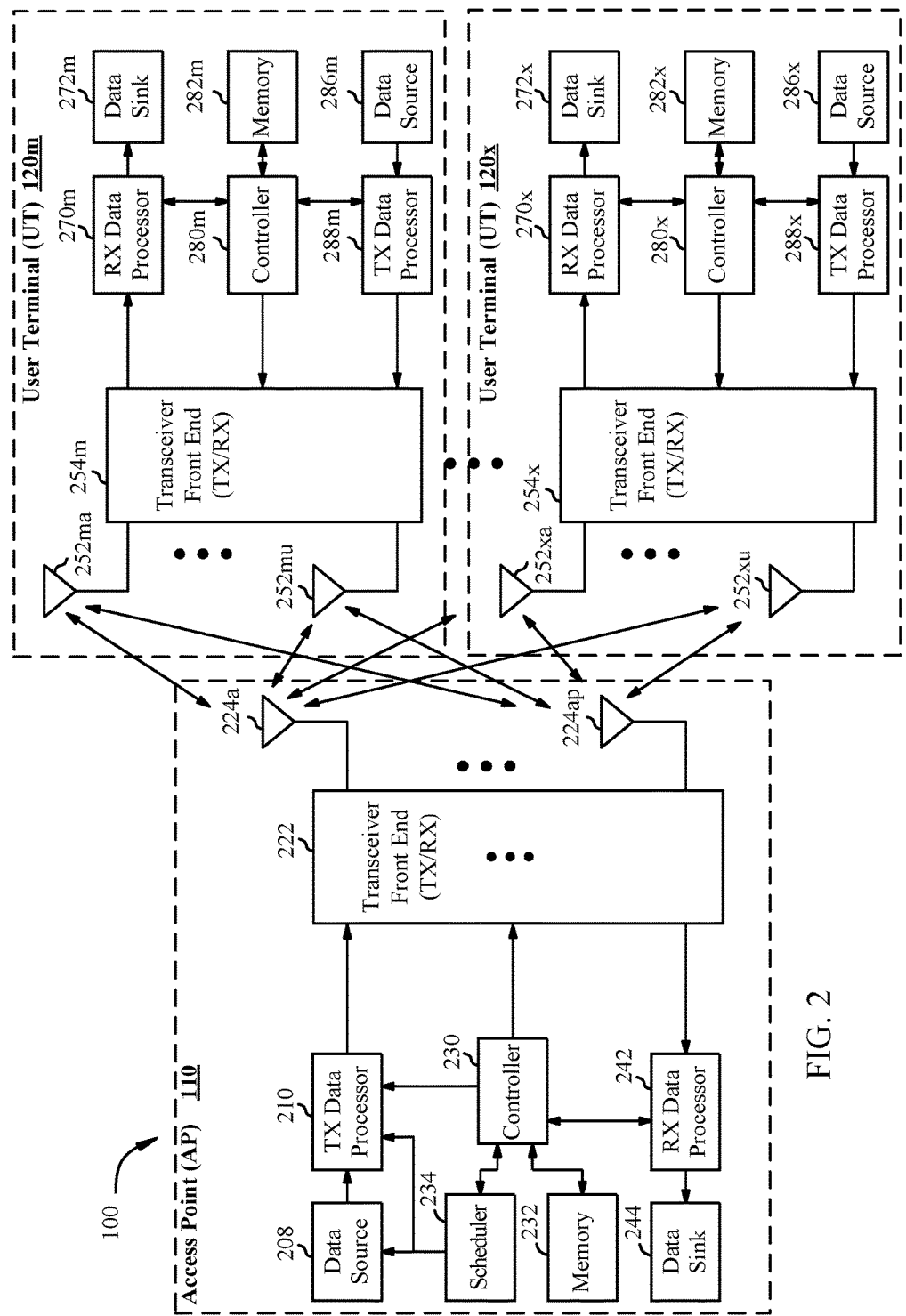
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,N}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a DAC implemented using a biasing circuit with reduced settling time as compared to conventional biasing circuits, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
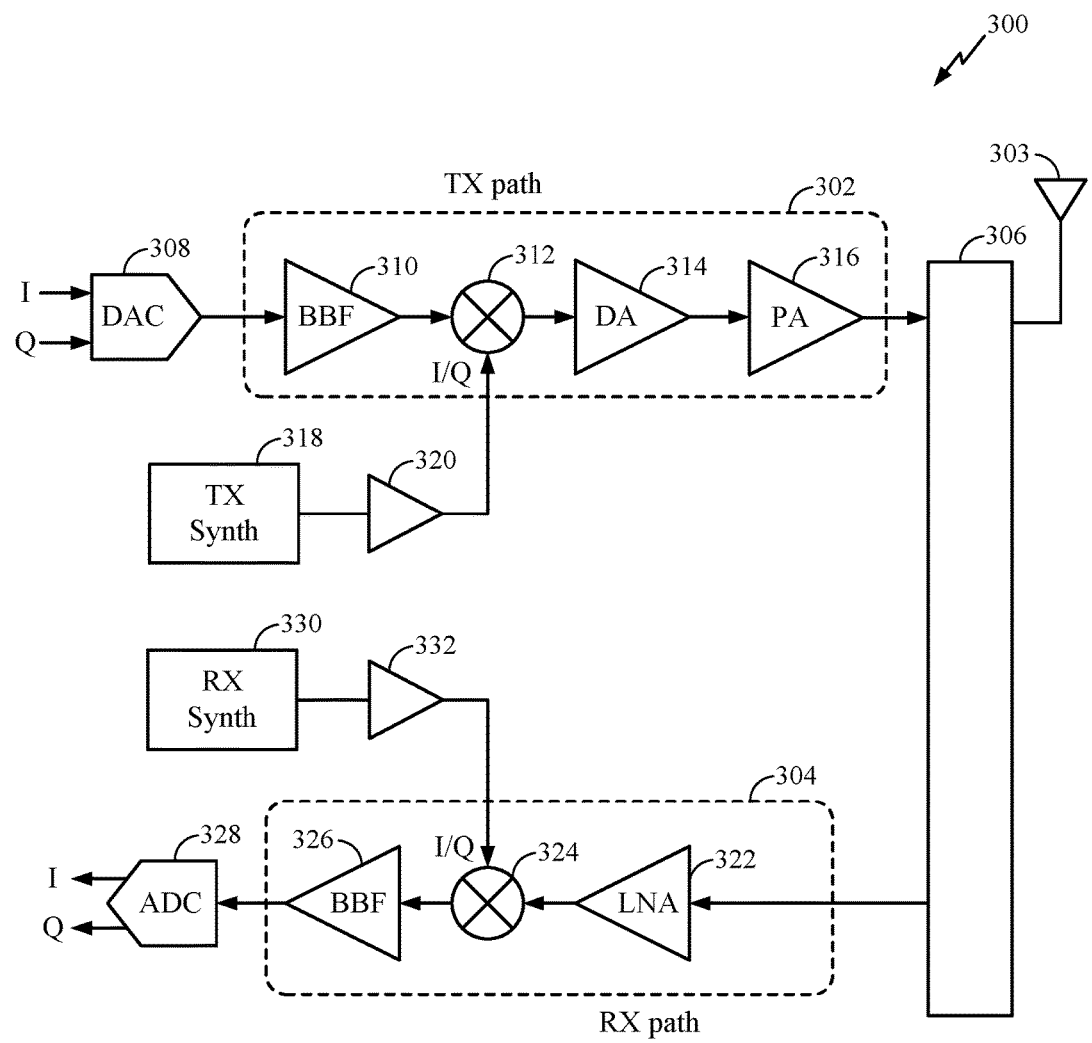
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. In certain aspects, the DAC 308 may be implemented using a biasing circuit with reduced settling time as compared to conventional biasing circuits, as described in more detail herein. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Digital-to-Analog Converter (DAC) with Reduced Settling Time

Certain aspects of the present disclosure are generally directed to a current-steering digital-to-analog converter (DAC) (e.g., corresponding to the DAC 308 described with respect to FIG. 3). The current-steering DAC may be implemented with a biasing circuit that allows for controlling the gain of the DAC. For example, the gain may be adjusted to adjust the power output of a power amplifier (e.g., power amplifier 316 described with respect to FIG. 3). When the gain of the DAC is changed, there is a delay, also referred to as the settling time of the current-steering DAC, for the DAC to settle to the new gain setting. This settling time impacts the amount of delay experienced from the moment the new gain setting is initiated until the moment when transmission signals may be processed at the new gain setting. Certain aspects of the present disclosure are generally directed to a biasing circuit for a current-steering DAC that improves the settling time of the DAC as compared to conventional implementations.

Figure 4:
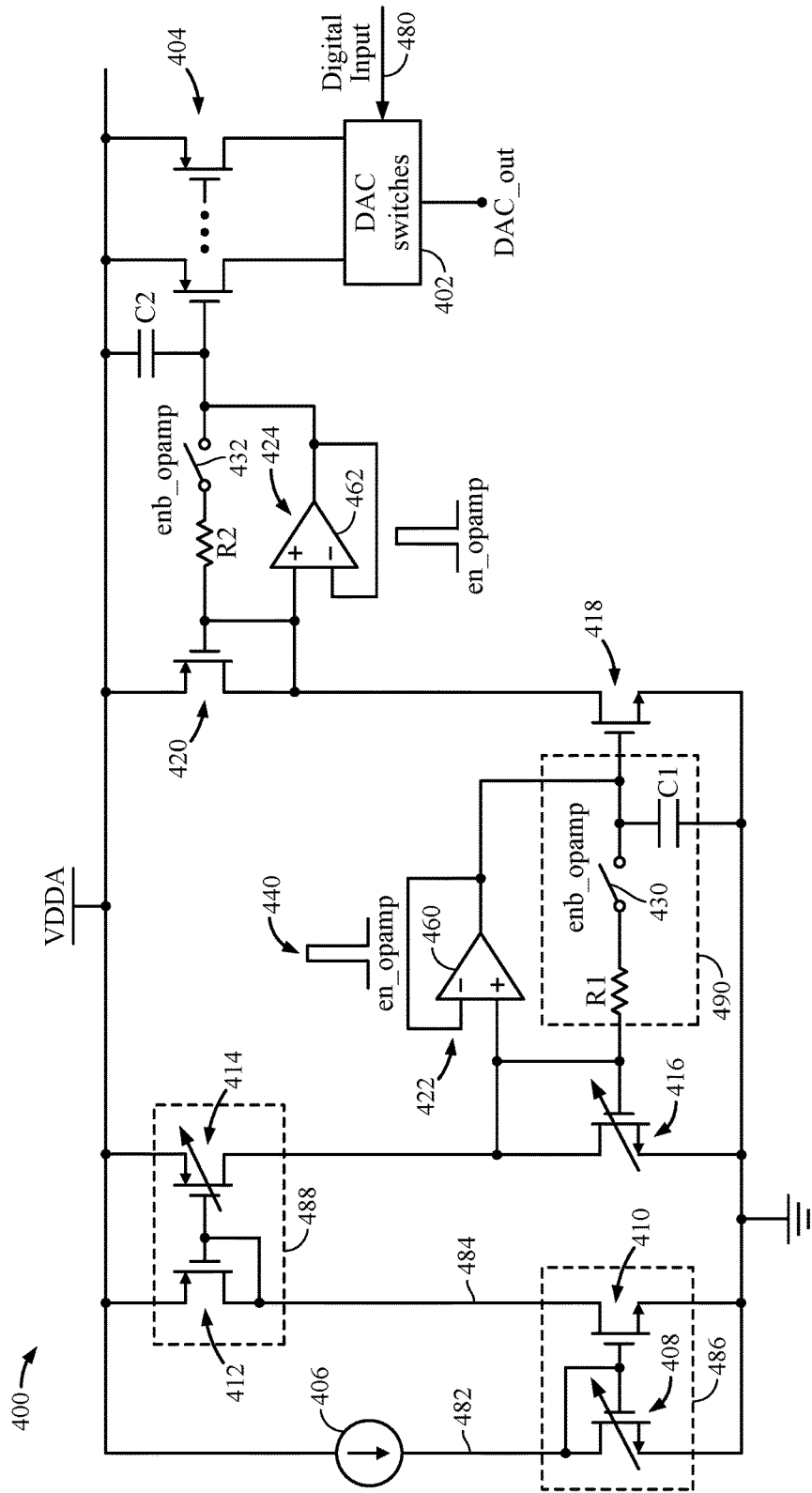
FIG. 4 is a circuit diagram of a current-steering digital-to-analog converter (DAC), in accordance with certain aspects of the present disclosure.

FIG. 4 is a circuit diagram of a current-steering DAC 400, in accordance with certain aspects of the present disclosure. The DAC 400 includes DAC switches 402 that selectively couple current sources 404 to the DAC output (DAC out) based on a digital input 480 to generate an analog signal. The current sources 404 (e.g., implemented using p-type metal-oxide semiconductor (PMOS) transistors) are biased using a biasing circuit including multiple current mirrors, as described in more detail herein.

The biasing circuit of the DAC 400 includes a current source 406 for providing a reference current to a first branch 482 of a current mirror 486 implemented using transistors 408, 410. A second branch 484 of the current mirror 486 may be coupled to another current mirror 488 implemented using transistors 412, 414. Either or both of the transistors 408, 414 may be configurable to adjust the gain of the DAC 400. The drain of transistor 414 is coupled to another current mirror implemented using transistors 416, 418. Configured as a diode-connected transistor, transistor 416 may also be configurable to adjust the gain of the DAC 400.

In certain aspects, a low-pass filter 490 may be coupled to the gates of transistors 416, 418 for noise filtering, as illustrated. The low-pass filter 490 may be implemented using a resistor-capacitor (RC) circuit having a resistive element R1 and capacitive element C1. Moreover, the current sources 404 are part of another current mirror formed with transistor 420 coupled to an analog voltage rail VDDA, to mirror the drain-to-source current of transistor 418. Like transistor 416, transistor 418 is illustrated as a diode-connected transistor and, as such, may be replaced by any suitable diode device. As illustrated, a low-pass filter 492 may also be coupled to the gate of transistor 420 for noise filtering. The low-pass filter 492 may be implemented as an RC circuit having a resistive element R2 and a capacitive element C2.

The RC circuits coupled to the gates of transistors 418, 420 increase the settling time of the DAC 400. Certain aspects of the present disclosure provide a buffer 422 (e.g., voltage buffer) selectively coupled in parallel with the resistive element R1, and a buffer 424 (e.g., voltage buffer) selectively coupled in parallel with resistive element R2, allowing the resistive elements R1, R2 to be effectively shorted upon a change of the gain of the biasing circuit to reduce the settling time to the new gain setting. For example, buffer 422 may be enabled, driving the gate of transistor 418 such that the voltages at the gates of transistors 418, 416 are about equal, effectively shorting the resistive element R1 and allowing the capacitive element C1 to be charged more quickly for the DAC 400 to operate at the new gain setting. The buffers 422, 424 may be enabled upon a change of the gain setting of the DAC 400, and subsequently disabled to continue the noise-filtering operations of the RC circuits. Disabling the buffers 422, 424 may be desirable to save power, especially in battery-operated devices.

As illustrated, the buffers 422, 424 may be controlled (e.g., enabled/disabled) via a control signal (en_opamp signal), which may be set by a controller (e.g., controller 230). When the buffers 422, 424 are disabled, the buffers 422, 424 effectively open circuit the paths parallel to resistive elements R1, R2, as described in more detail herein.

As illustrated, each of the buffers 422, 424 is implemented using an amplifier 460, 462 configured as a voltage buffer. For example, each of the amplifiers 460, 462 have a negative input terminal coupled to an output of the amplifier. The amplifiers 460, 462 may be implemented to consume zero or close to zero static current, with ultra-low input referred noise and offset, and with little kickback (i.e., glitch) when the amplifier is turned off or on, as described in more detail herein. The amplifiers may also consume relative low area as compared to the capacitive elements C1, C2.

In certain aspects, switches 430, 432 may be coupled to resistive elements R1, R2, respectively. The switches 430, 432 are controlled by an enb_opamp signal, which is an inverse of the en_opamp signal used to enable/disable the buffers 422, 424. For example, the switch 430 is opened when the buffer 422 is activated such that the voltages at the gates of transistors 416, 418 are about equal. In certain aspects, the rising edge of the pulse 440 of the en_opamp signal may be synchronized with a full scale change signal used to set a new gain setting of the DAC 400 and may have a pulse width of less than 1 μs (e.g., 0.8 μs (or less)) to enable fast charging of capacitive elements C1, C2. The buffers 422, 424 may be deactivated after around 0.8 μs (e.g., at the falling edge of the pulse 440), and any residual settling for the new gain setting may be performed after the buffers 422, 424 are deactivated.

Figure 5:
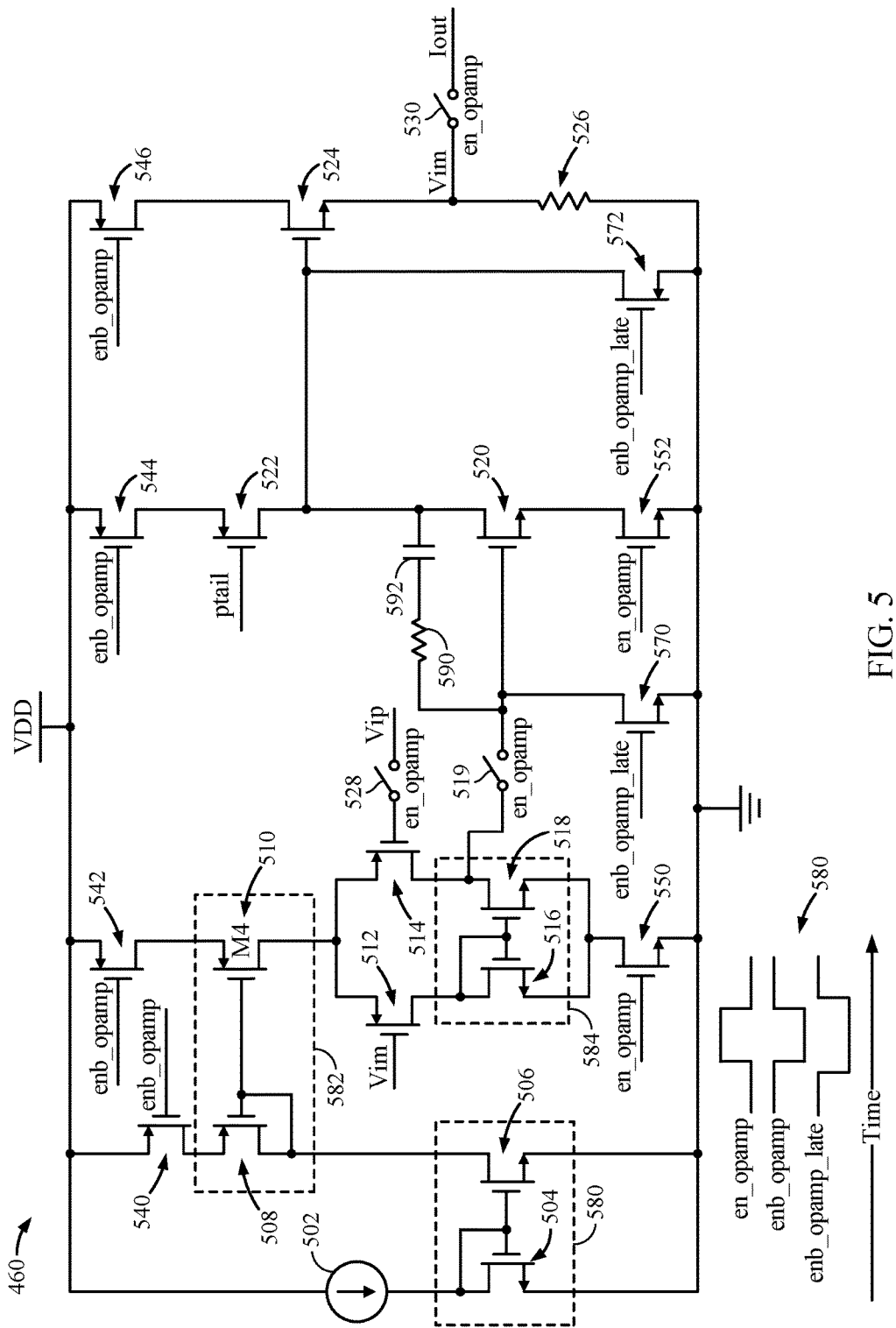
FIG. 5 is an example circuit diagram of an amplifier of the DAC of FIG. 4, in accordance with certain aspects of the present disclosure.

FIG. 5 is an example circuit diagram of the amplifier 500, in accordance with certain aspects of the present disclosure. The amplifier 500 may correspond to at least one of the amplifier 460 or amplifier 462. The amplifier includes a current source 502 coupled to transistors 504, 506 forming a current mirror 580. The transistors 508, 510 form another current mirror 582 for providing a biasing current to transistors 512, 514. The transistors 512, 514 receive a different input voltage pair Vip (input voltage plus) and Vim (input voltage minus) to be amplified. The transistors 512, 514 are coupled to a current mirror 584 formed by transistors 516, 518 to generate an amplified signal at the drain of the transistor 518.

The drain of transistor 518 may be selectively coupled to a transistor 520 through a switch 519. The switch 519 may be controlled via the en_opamp signal. The transistor 520 is coupled to transistor 522 for providing a reference current. The drain of transistor 520 is coupled to a gate of transistor 524 having a source coupled to a resistive element 526 (e.g., forming a source follower circuit), the output of the amplifier 500 being at the source of the transistor 524. In certain aspects, a resistive element 590 coupled in series with a capacitive element 592 may be coupled between the drain and gate of transistor 520. The resistive elements 590 and the capacitive element 592 provide stability for the amplifier 500.

In certain aspects, switches 528, 530 may be coupled to the positive input terminal and the output terminal of the amplifier, respectively, as illustrated. The switches 528, 530 may be controlled via the en_opamp signal to enable or disable the amplifier 500. For example, when the en_opamp signal is logic high, the switches 528, 530 are closed, enabling the amplifier 500.

In certain aspects, switches 540, 542, 544, 546, implemented using PMOS transistors, may be coupled to transistors 508, 510, 522, 524, respectively, as illustrated. The switches 540, 542, 544, 546 are controlled via the enb_opamp signal, and thus, are closed when the amplifier 500 is enabled (i.e., the enb_opamp signal is logic low). Moreover, switch 550 is coupled to sources of transistors 516, 518, and the switch 552 is coupled to the source of transistor 520. The switches 550, 552, implemented using n-type metal-oxide semiconductor (NMOS) transistors, may be controlled via the en_opamp signal. Thus, the switches 540, 542, 544, 546, 550, 552 are opened when the amplifier 500 is disabled (i.e., the en_opamp signal is logic low and the enb_opamp signal is logic high), reducing current sunk from the voltage rail VDD and reducing the power consumption of the amplifier 500 when the amplifier 500 is disabled.

In certain aspects, switches 570, 572 may be coupled between gates of transistors 520, 524, respectively, and a reference potential node (e.g., electric ground). The switches 570, 572 are controlled via an enb_opamp_late signal. The switches 570, 572 couple the gates of transistors 520, 524 to the reference potential node when the amplifier 500 is disabled such that the gates of transistors 520, 524 are not electrically floating. For example, as illustrated by the timing diagram 580, the falling edge of the enb_opamp_late signal occurs prior to the falling edge of the enb_opamp signal, and the rising edge of the enb_opamp_late signal occurs after the rising edge of the enb_opamp signal. Therefore, the switches 570, 572 are opened prior to the activation of the amplifier 500, and closed after the deactivation of the amplifier 500.

In certain aspects, the size of the transistor 520 may be twice the size of each of the transistors 516, 518. Moreover, the size of transistors 510, 522 may be about equal.

Figure 6:
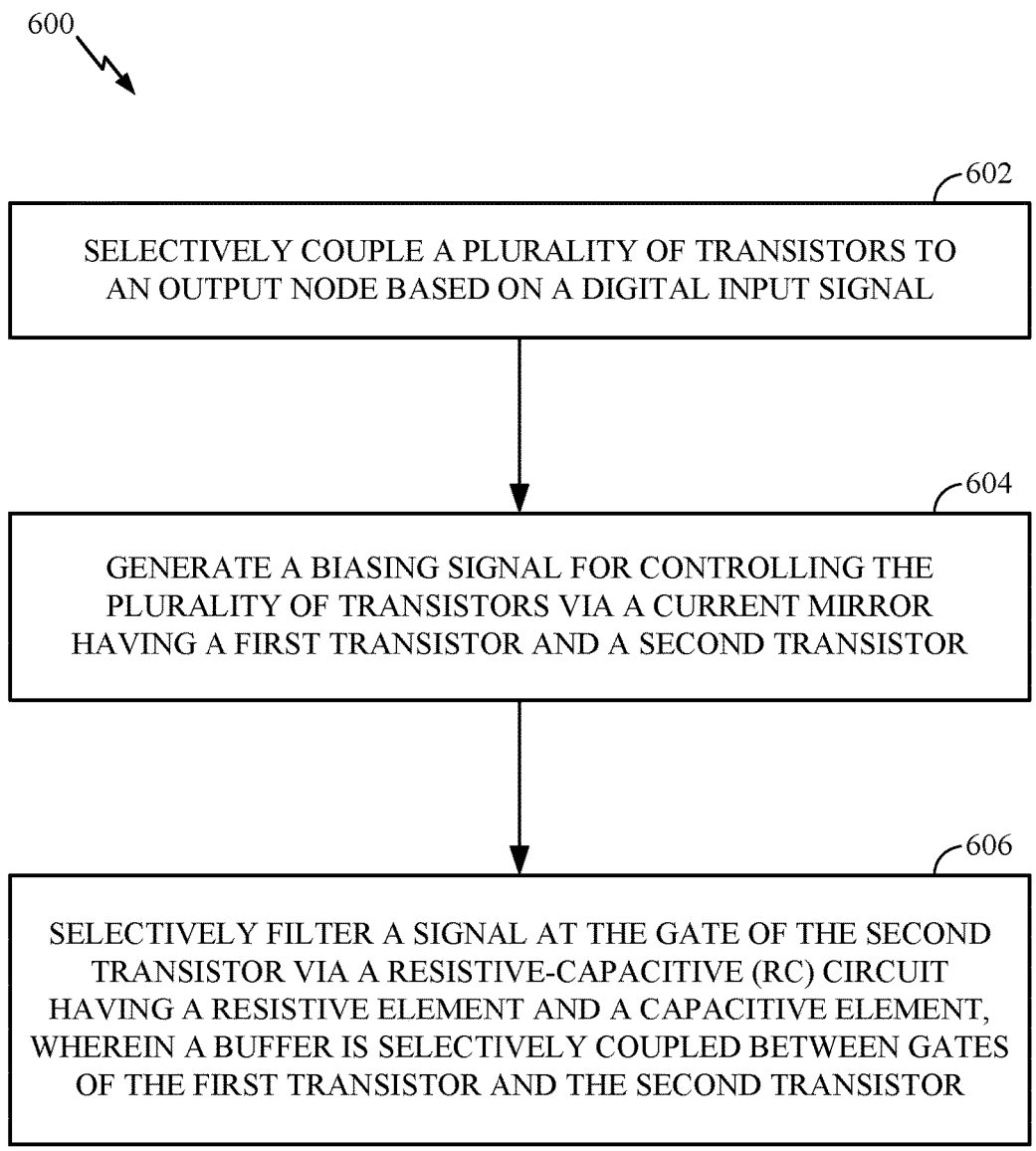
FIG. 6 is a flow diagram of example operations for digital-to-analog conversion, in accordance with certain aspects of the present disclosure.

FIG. 6 is a flow diagram of example operations 600 for digital-to-analog conversion, in accordance with certain aspects of the present disclosure. The operations 600 may be performed by a DAC, such as the DAC 400 described with respect to FIGS. 4 and 5.

The operations 600 may begin, at block 602, by selectively coupling a plurality of transistors (e.g., current sources 404) to an output node based on a digital input signal, and at block 604, generating a biasing signal for controlling the plurality of transistors via a current mirror having a first transistor (e.g., transistor 418) and a second transistor (e.g., transistor 416). At block 606, the DAC may selectively filter a signal at the gate of the second transistor via a resistive-capacitive (RC) circuit having a resistive element (e.g., resistive element R1) and a capacitive element (e.g., capacitive element C1). In certain aspects, a buffer (e.g., buffer 422) may be selectively coupled between gates of the first transistor and the second transistor.

The DAC 400 described herein allows for a settling time of less 1 µs. Moreover, the amplifiers of the biasing circuit described herein may be only enabled when switching the gain of the biasing circuit. Noise filtering may also be implemented to improve noise performance without adversely impacting the settling time of the DAC 400.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A digital-to-analog converter (DAC), comprising:
   a plurality of transistors selectively coupled to an output of the DAC; and
   a biasing circuit coupled to gates of the plurality of transistors, wherein the biasing circuit comprises:
   a first transistor having a gate coupled to a drain of the first transistor;
   a first buffer having an input coupled to the gate of the first transistor;
   a second transistor having a gate coupled to an output of the first buffer;
   a first resistive-capacitive (RC) circuit having a first resistive element and a first capacitive element, the first RC circuit being coupled between the gate of the first transistor and the gate of the second transistor; and
   a first switch coupled between the first resistive element and the first capacitive element.

2. The DAC of claim 1, wherein the plurality of transistors comprises the second transistor.

3. The DAC of claim 1, wherein:
   the first resistive element comprises a first terminal coupled to the gate of the first transistor and a second terminal coupled to a first terminal of the first switch; and
   the first capacitive element comprises a first terminal coupled to a second terminal of the first switch, and a second terminal coupled to a source of the second transistor.

4. The DAC of claim 1, wherein the biasing circuit further comprises:
   a third transistor having a gate coupled to a drain of the third transistor;
   a second buffer having an input coupled to the gate of the third transistor, and an output coupled to gates of the plurality of transistors;
   a second resistive-capacitive (RC) circuit having a second resistive element and a second capacitive element, the second RC circuit being coupled between the gate of the third transistor and the gates of the plurality of transistors; and
   a second switch coupled between the second resistive element and the second capacitive element.

5. The DAC of claim 4, wherein a drain of the second transistor is coupled to a drain of the third transistor.

6. The DAC of claim 1, wherein the biasing circuit further comprises a first current mirror coupled to the first transistor.

7. The DAC of claim 6, wherein the biasing circuit further comprises a second current mirror having a first branch coupled to a current source and a second branch coupled to a first branch of the first current mirror, the second branch of the first current mirror being coupled to the first transistor.

8. The DAC of claim 1, wherein the first buffer comprises an amplifier having a positive input terminal coupled to the gate of the first transistor and a negative input terminal coupled to an output of the amplifier, the output of the amplifier being coupled to the gate of the second transistor.

9. The DAC of claim 8, wherein the amplifier comprises:
   a third transistor;
   a fourth transistor having a source coupled to a source of the third transistor;
   a current mirror coupled to drains of the third transistor and the fourth transistor; and
   a second switch coupled between a gate of the fourth transistor and the positive input terminal of the amplifier.

10. The DAC of claim 9, wherein the first switch and the second switch are configured to be controlled via a control signal for enabling or disabling the amplifier.

11. The DAC of claim 9, wherein the amplifier further comprises a third switch coupled between the current mirror and a reference potential node.

12. The DAC of claim 11, wherein the first switch, the second switch, and the third switch are configured to be controlled via a control signal for enabling or disabling the amplifier.

13. The DAC of claim 9, wherein the amplifier further comprises:
   a current source coupled to the sources of the third transistor and the fourth transistor; and
   a third switch coupled between the current source and a voltage rail.

14. The DAC of claim 13, wherein the third switch is configured to be controlled via a control signal being an inverse of another control signal used to control the first switch and the second switch.

15. The DAC of claim 9, wherein the amplifier further comprises:
   a fifth transistor;
   a third switch coupled between a gate of the fifth transistor and the drain of the fourth transistor;
   a first current source coupled to a drain of the fifth transistor;
   a fourth switch coupled between a source of the fifth transistor and a reference potential node; and
   a fifth switch coupled between the gate of the fifth transistor and the reference potential node.

16. The DAC of claim 15, wherein the amplifier is configured to open the fifth switch prior to closing the first, second, third, and fourth switches, and close the fifth switch after opening the first, second, third, and fourth switches.

17. The DAC of claim 15, wherein the amplifier further comprises:
   a sixth transistor having a gate coupled to the drain of the fifth transistor and a source coupled to a gate of the third transistor;
   a second resistive element coupled to the source of the sixth transistor; and
   a sixth switch coupled between the source of the sixth transistor and the gate of the second transistor.

18. The DAC of claim 17, wherein the first, second, third, fourth, and sixth switches are configured to be controlled via a control signal for enabling or disabling the amplifier.

19. A digital-to-analog converter (DAC), comprising:
   a plurality of transistors selectively coupled to an output of the DAC; and
   a biasing circuit coupled to gates of the plurality of transistors, wherein the biasing circuit comprises:
      a first transistor having a gate coupled to a drain of the first transistor;
      a buffer having an input coupled to the gate of the first transistor;
      a second transistor;
      a switch coupled between a gate of the second transistor and an output of the buffer; and
      a low-pass filter coupled between the gate of the first transistor and the gate of the second transistor.

20. A method for digital-to-analog conversion, comprising:
   selectively coupling a plurality of transistors to an output node based on a digital input signal;
   generating a biasing signal for controlling the plurality of transistors via a current mirror having a first transistor and a second transistor; and
   selectively filtering a signal at a gate of the second transistor via a low-pass filter, wherein a buffer is selectively coupled between gates of the first transistor and the second transistor.

* * * * *